(12) United States Patent
Boskamp et al.

(10) Patent No.: US 7,525,313 B2
(45) Date of Patent: Apr. 28, 2009

(54) SYSTEM AND METHOD FOR MULTI-CHANNEL MR TRANSMISSION

(75) Inventors: Eddy Benjemin Boskamp, Menomonee Falls, WI (US); Graeme C. McKinnon, Hartland, WI (US)

(73) Assignee: General Electric Company, Schenectady, NY (US)

( * ) Notice: Subject to any disclaimer, the term of this patent is extended or adjusted under 35 U.S.C. 154(b) by 76 days.

(21) Appl. No.: 11/744,687

(22) Filed: May 4, 2007

(65) Prior Publication Data

US 2008/0272787 A1    Nov. 6, 2008

(51) Int. Cl.
*G01V 3/00* (2006.01)
(52) U.S. Cl. .......................... 324/318; 324/309
(58) Field of Classification Search .......... 324/300–322
See application file for complete search history.

(56) References Cited

U.S. PATENT DOCUMENTS

| | | | | |
|---|---|---|---|---|
| 6,040,697 | A * | 3/2000 | Misic | 324/318 |
| 6,253,101 | B1 * | 6/2001 | Seng et al. | 600/410 |
| 6,597,173 | B1 * | 7/2003 | Bernstein | 324/318 |
| 6,608,480 | B1 * | 8/2003 | Weyers | 324/318 |
| 6,798,206 | B2 * | 9/2004 | Misic | 324/322 |
| 2006/0103386 | A1 * | 5/2006 | Buchwald | 324/322 |

OTHER PUBLICATIONS

Alagappan et al., "An 8 Channel Transmit Coil for Transmit Sense at 3T," Proc. Intl. Soc. Mag. Reson. Med. 14 (2006), p. 121.
Vernickel et al., "An Eight Channel Transmit/Receive Body Coil for 3T," Proc. Intl. Soc. Mag. Reson. Med. 14 (2006), p. 123.
Fontius et al., "A flexible 8-channel RF transmit array system for parallel excitation," Proc. Intl. Soc. Mag. Reson. Med. 14 (2006), p. 127.
Nistler et al., "A degenerate bandpass birdcage as antenna for a 3T wholebody transmit array," Proc. Intl. Soc. Mag. Reson. Med. 14 (2006), p. 2566.

* cited by examiner

*Primary Examiner*—Brij B Shrivastav
(74) *Attorney, Agent, or Firm*—Ziolkowski Patent Solutions Group, SC

(57) ABSTRACT

A system and method for transmitting multiple radio frequency (RF) channels via an RF coil assembly are provided. An RF coil assembly having a number of coil elements may be configured to transmit a number of RF channels which is less than the number of coil elements thereof. Some implementations may use signal splitters for some or all of the RF channels to produce driving inputs for each coil element. By using more coil elements than RF channels, various embodiments may exhibit increased power efficiency and improved B1 uniformity.

23 Claims, 6 Drawing Sheets

SYSTEM AND METHOD FOR MULTI-CHANNEL MR TRANSMISSION

BACKGROUND OF THE INVENTION

The present invention relates generally to magnetic resonance (MR) imaging, and more specifically, to a system and method for transmitting multiple radio frequency (RF) channels via a multi-element RF coil assembly. In some embodiments, the number of independent RF channels communicated to the RF coil assembly may be less than the number of coil elements in the assembly. In such a case, one or more of the RF channels may be split and/or phase shifted for application to more than one coil element.

MR imaging in general is based upon the principle of nuclear magnetic resonance. When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field, such as a $B_1$ excitation field, which is in the x-y plane and which is near the Larmor frequency, the net aligned moment, or "longitudinal magnetization", $M_z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received MR signals are digitized and processed to reconstruct the image using one of many well known reconstruction techniques.

One goal in MR imaging is to produce a homogenous $B_1$ excitation field such that a desired magnetization effect caused by the $B_1$ field will be produced as intended. In classic "birdcage" coils, the energy in an ideal $B_1$ field, measured in Joules, is determined for the loops of a coil based upon:

$$J_N = J_0 \cdot \cos(\omega t + N\Delta\Phi) \qquad \text{Eqn. 1}$$

where $\omega$ is the characteristic Larmor frequency for the spins of interest, N is the number of loops in the birdcage coil, and $\Delta\Phi$ is the angular distance between loops. Since all loops are electrically interconnected, the birdcage coil acts like a transmission line with one wavelength existing about the entirety of the structure. In normal 1.5 T imaging, the Larmor frequency for protons is about 64 MHz and permittivity of human tissue (or other objects of interest) is generally not a significant factor in producing appreciable $B_1$ inhomogeneities.

However, in high field imaging, such as where the composite B fields are on the order of 3 T or 7 T, the Larmor frequency for protons is higher, due to $f=\gamma \cdot B$. For example, in 3 T imaging, the Larmor frequency for protons is about 127 MHz. Thus, wavelengths for the RF transmissions become shorter and the permittivity of a tissue to be imaged can become a factor. The relative permittivity of human tissue can have values of $E_R$ from about 6 to 70. Significant phase changes as well as signal attenuations can occur in an RF transmission as it passes into and through an imaging tissue under these conditions. Such phenomena can cause both constructive and destructive interference with the RF transmissions from the other loops of an RF coil. Therefore, even when the transmissions from loops of a coil are carefully tuned to produce an ideal homogenous $B_1$ field, inhomogeneities may still be produced at high Tesla fields and Eqn. 1 may not hold in reality. Inhomogeneous $B_1$ fields lead to inaccurate flip angle distributions in a field of view (FOV) and dark areas in images.

One way to help prevent these inhomogeneities is to utilize a technique known as RF shimming. RF shimming involves adjusting the signal inputs for each loop of a coil assembly to account for expected or measured field inhomogeneities. "Passive" RF shimming includes splitting, phase shifting, amplifying, attenuating, or otherwise tuning the same RF waveform to produce varying inputs for each coil. "Dynamic" RF shimming includes producing unique RF waveforms for each coil and accounting for inhomogeneities in the design of the waveforms.

Classic birdcage coil assemblies are not known to implement RF shimming techniques as effectively as transverse electro-magnetic (TEM) coil assemblies. TEM coil assemblies have individual coil elements which can be driven separately, making them more ideal for multi-channel transmissions such as parallel transmission. However, known TEM coil assemblies generally experience coupling or mutual inductance between neighboring coil elements and non-neighboring coil elements, and between coil elements and the RF shield. This coupling is relied upon to characterize the TEM coil assembly as a single resonator in design techniques. Additionally, known TEM coil assemblies use either one RF waveform input, or a multi-channel RF input which is tailored to the structure of the TEM coils.

It would therefore be desirable to have a system and method for effectively reducing or eliminating $B_1$ inhomogeneities in high field imaging. It would be further desirable for such system and method to present an RF coil assembly which is capable of operating without coupling and which is capable of transmitting a variety of multi-channel RF inputs.

BRIEF DESCRIPTION OF THE INVENTION

Embodiments of the present invention provide a system and method of transmitting a multi-channel RF pulse sequence via a multi-element coil array. By decoupling neighboring coil elements, carefully selecting coil widths and spacing, and/or by having more coil elements than transmit channels, increased power efficiency and improved $B_1$ homogeneity can be achieved.

In accordance with one aspect of the invention, an MR imaging apparatus includes a main magnet having a bore therethrough and a plurality of gradient coils positioned about the bore of the main magnet. The apparatus further includes an RF coil assembly that is also disposed within the bore of the main magnet. A pulse module of the apparatus is adapted to output a plurality of RF transmit channels to the RF coil assembly for transmission during an imaging sequence. The RF coil assembly has a plurality of individual coil elements which is greater in number than the plurality of RF transmit channels.

According to another aspect of the invention, a method for configuring an RF transmit system is provided. The method includes the steps of affixing a plurality of coil elements about a frame, connecting an RF pulse input line to a signal splitter, and routing the outputs from the signal splitter to drive less than all of the coil elements. The method also includes the step of connecting at least one additional RF pulse input line to the remainder of the coil elements to drive the coil elements.

In accordance with a further aspect of the invention, an RF coil assembly is provided. The RF coil assembly includes a volume coil structure which has an opening therethrough and an end ring. The coil assembly also includes a plurality of conductive segments positioned about a surface of the volume coil structure in a transverse electro-magnetic (TEM) arrangement. A driving input array of the coil assembly is configured to receive input signals representing a multi-channel transmission and communicate the signals to drive the conductive segments. The RF coil assembly also has at least one channel splitter connected to receive a single channel of the multi-channel transmission and provide at least two of the input signals.

Various other features and advantages will be made apparent from the following detailed description and the drawings.

BRIEF DESCRIPTION OF THE DRAWINGS

The drawings illustrate embodiments presently contemplated for carrying out the invention.

In the drawings.

DETAILED DESCRIPTION OF THE PREFERRED EMBODIMENT

Figure 1:
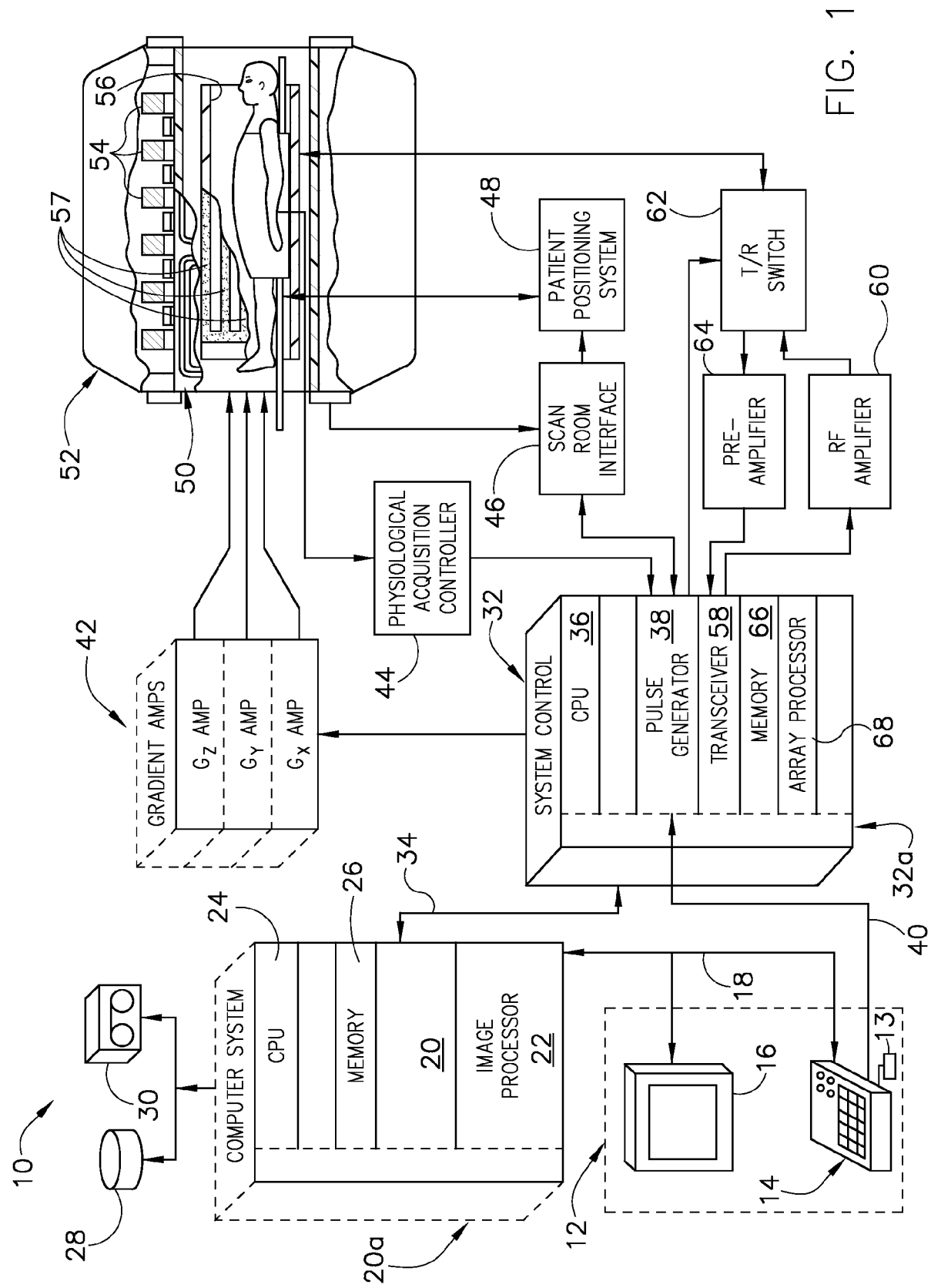
FIG. 1 is a schematic block diagram of an exemplary MR imaging system for use with an embodiment of the present invention.

Referring to FIG. 1, the major components of a preferred magnetic resonance imaging (MRI) system 10 incorporating an embodiment of the present invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and an RF coil assembly 56. RF coil assembly 56 includes a number of coil elements 57. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 or a separate RF coil (not shown). The sensed signals are coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a head coil or surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to a data processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the optical disk drive 30, or it may be further processed by the image processor 22 and conveyed to the operator console 12 and presented on the display 16.

Figure 2:
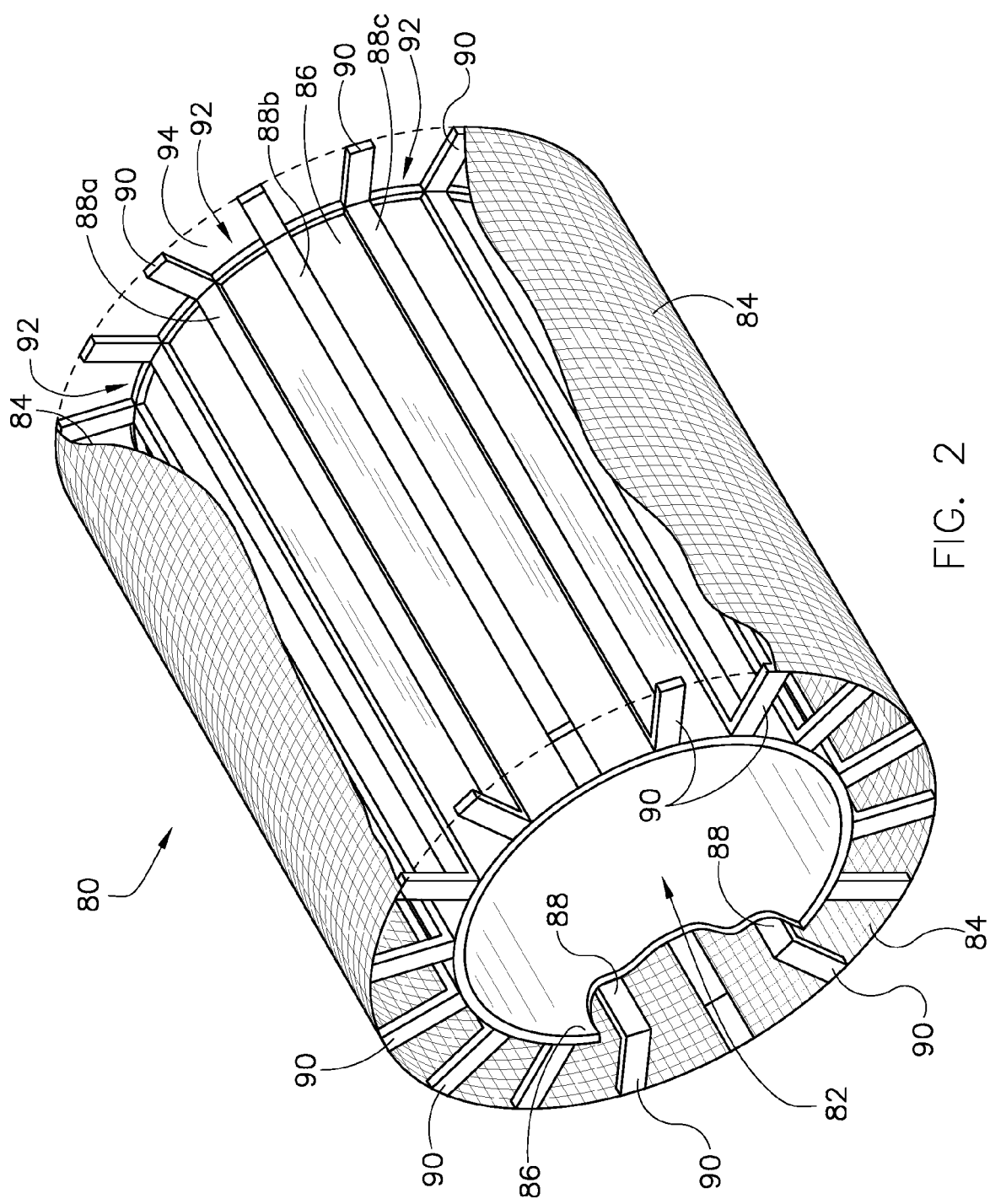
FIG. 2 is a perspective view of an exemplary RF coil assembly in partial cut-away.

FIG. 2 depicts one exemplary configuration for an RF coil assembly for use in an MR imaging system, such as that shown in FIG. 1. The RF coil assembly 80 of FIG. 2 is a generally cylindrical-shaped volume coil assembly. It is also contemplated that embodiments of the invention may be implemented with other coil types, such as head coils. RF coil assembly 80 is configured to transmit one or more RF waveforms to generate a B1 field in an interior volume 82 thereof.

In the embodiment shown, RF coil assembly 80 is arranged as a transverse electro-magnetic (TEM) coil assembly. In this regard, RF coil assembly 80 includes an outer RF shield 84, surrounding a hollow cylindrical structure or frame 86. RF shield 84 may be formed of a copper mesh or other conductive materials suitable for shielding RF transmissions.

The RF shield 84 of RF coil assembly 80 is shown in partial cut-away to reveal three coil elements 88a, 88b, 88c. As arranged, RF coil assembly 80 has a total of sixteen coil elements 88 spaced evenly about the circumference of frame 86. However, it is to be understood that various configurations of RF coil assembly 80 may have any number of coil elements. As can be seen from the depiction of coil elements 88a, 88b, and 88c, the coil elements 88 are laid out lengthwise as conductive segments along the primary axis of frame 86. In one embodiment, the coil elements 88 are copper strips having widths of approximately 1.25 inches and lengths of approximately 460 mm. However, it is appreciated that similar widths and lengths may equivalently achieve the advantages discussed herein when the coil elements 88 are evenly spaced about frame 86.

Coil elements 88 are each in electrical communication with the common RF shield 84 via connectors 90 at the ends of the coil elements 88. Thus, RF shield 84 may act as a current return path when the coil elements 88 are being used for RF transmission. On one end ring 94 of coil assembly 80, a decoupling element 92 is attached between each coil element 88. As will be explained below, decoupling neighboring coil elements 88 provides for improved control over transmissions from each coil element.

Coupling or mutual inductance experienced between non-neighboring coil elements, such as between coil element 88a and coil element 88c, is diminished due to the relatively narrow width of the coil elements 88 and the distance therebetween. That is, compared to known TEM-type coil assemblies, coil elements 88 are relatively small and spaced further apart. Mutual inductance experienced between non-neighboring coil elements is, therefore, not significant in comparison to the strength of the signals applied to the coil elements 88 for transmission.

Additionally, the sixteen element RF coil array 80 achieves an improved power efficiency over an eight element RF coil array (not shown). In whole body volume coils, the RF shield 84 is often relatively close to the coil elements 88. As a result, the efficiency of the coil assembly 80 is determined by losses in the structure as opposed to losses caused by the imaging subject. With more elements, the current per coil element 88 used to drive the coil assembly 80 can be reduced. Compared to an eight element coil assembly, a sixteen element coil assembly can have a power efficiency improved by a factor of two.

Figure 3:
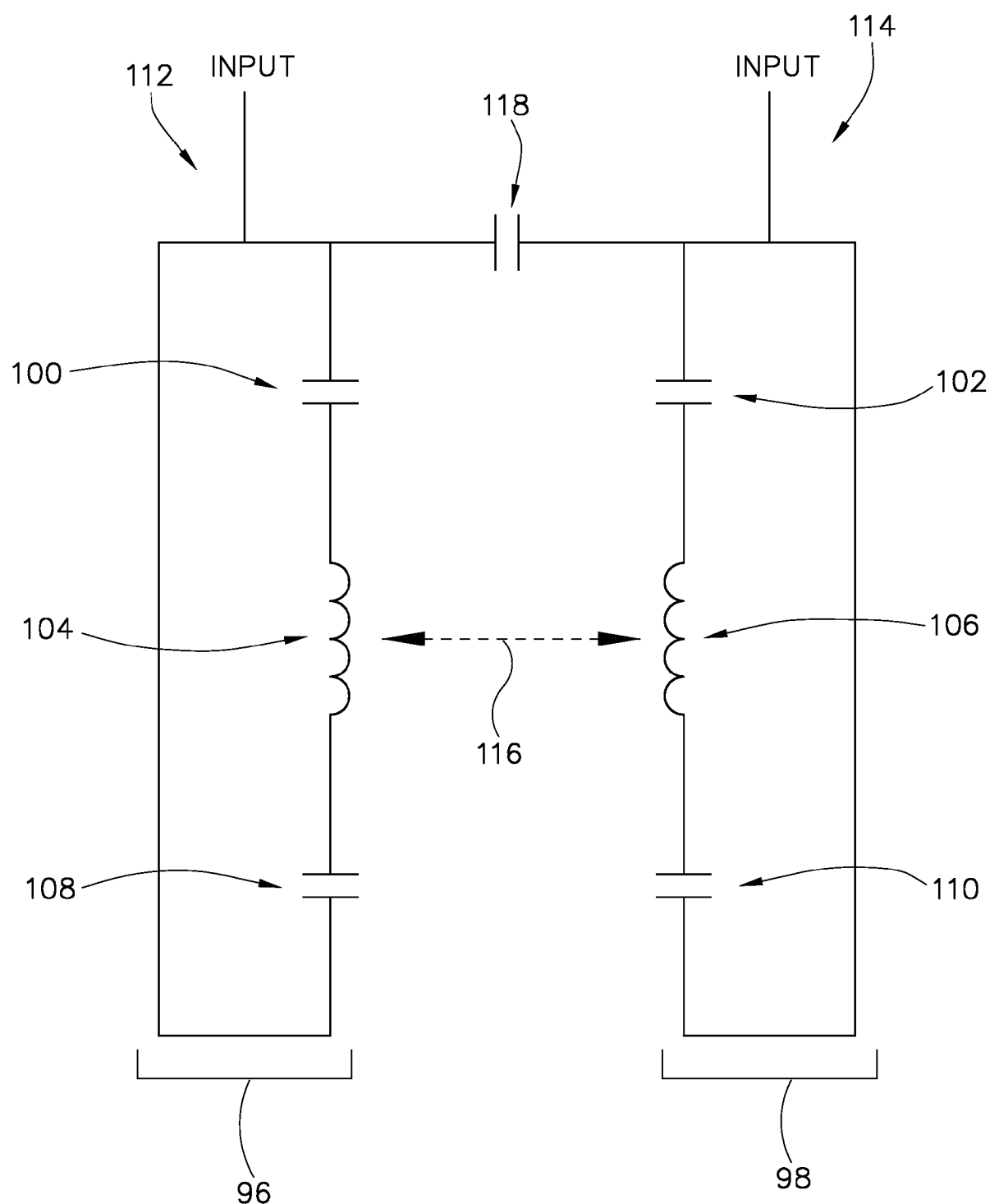
FIG. 3 is a circuit diagram representing a pair of coil elements of the RF coil assembly of FIG. 2.

Referring now to FIG. 3, a circuit model of a pair of neighboring coil elements 96, 98 is shown, illustrating a minimization of the coupling or mutual inductance therebetween. Each coil element 96, 98 may be modeled as a current loop having a first capacitance 100, 102, then an inductance 104, 106, and another capacitance 108, 110. The current return paths 120, 122 are provided via the RF shield shown in FIG. 2. The circuit model of FIG. 3 illustrates that, when input signals 112, 114 are applied to the coil elements 96, 98, a coupling or mutual inductance 116 is experienced between the two coil elements. That is, a portion of the energy from the signal 112 applied at coil 96 is transferred to coil 98, and vice versa. However, when a decoupling element, such as a capacitor 118, is connected between the coils 96, 98 at one end, this mutual inductance is substantially eliminated. Each coil element 96, 98 can thus be controlled more independently of other coils. Due to such a decoupling, an RF coil assembly such as that shown in FIG. 2 need not be treated as a single resonator.

Figure 4:
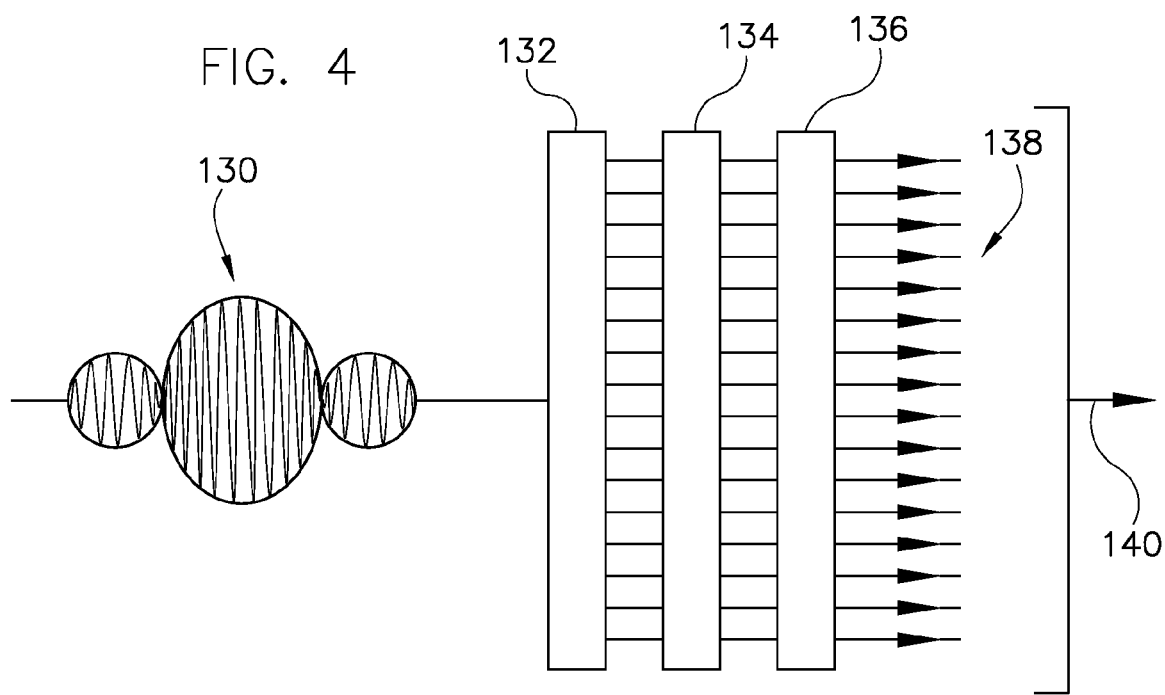
FIG. 4 is a block diagram of a signal splitter for a single channel RF transmission.

Referring now to FIG. 4, a block diagram of a signal splitting configuration for providing driving inputs to sixteen coil elements is shown. The configuration of FIG. 4 is a single mode configuration in which one RF waveform or transmit channel 130 is split to provide a number of driving inputs. As shown, RF waveform 130 is applied first to a sixteen-way power splitter 132. The outputs of power splitter 132 are then appropriately amplitude adjusted by attenuators 134 and phase shifted by phase shifters 136, then amplified by sixteen amplifiers 138. The degrees of individual amplitude and phase adjustment of each output signal 140 may be determined according to a passive RF shimming design technique. Each output signal 140 is therefore appropriately scaled and phase shifted to produce a substantially homogenous $B_1$ field when transmitted by coil elements evenly spaced about an RF coil assembly.

Figure 5:
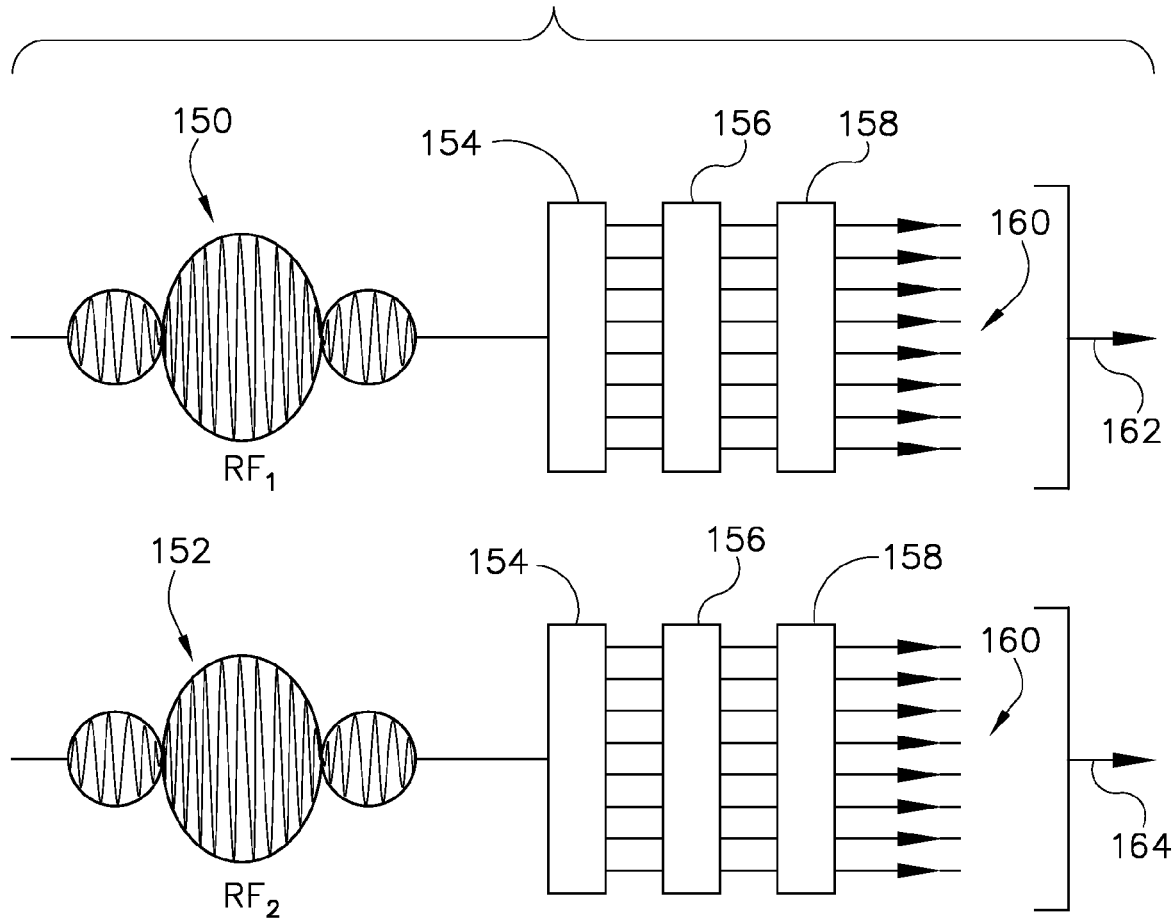
FIG. 5 is a block diagram of a pair of signal splitters for a two channel RF transmission

FIG. 5 depicts a block diagram of an alternative signal splitting configuration for providing driving inputs to sixteen coil elements. Two separate transmit channels or RF waveforms 150, 152 may be designed and used as inputs. The RF waveforms 150, 152 may be designed individually according to a dynamic RF shimming design technique. That is, the RF waveform inputs 150, 152 themselves are designed to account for and/or correct expected or measured $B_1$ inhomogeneities. Each RF waveform 150, 152 of FIG. 5 is applied to a respective eight-way power splitter 154, a series of attenuators 156, a series of phase shifters 158, and a series of amplifiers 160, to produce eight distinct driving input signals for eight separate, independently driven coil elements (not shown). In other words, a passive RF shimming technique may be used to divide the signals from each RF waveform for improved B1 homogeneity in addition to the dynamic RF shimming technique used to design the waveforms 150, 152.

Figure 6:
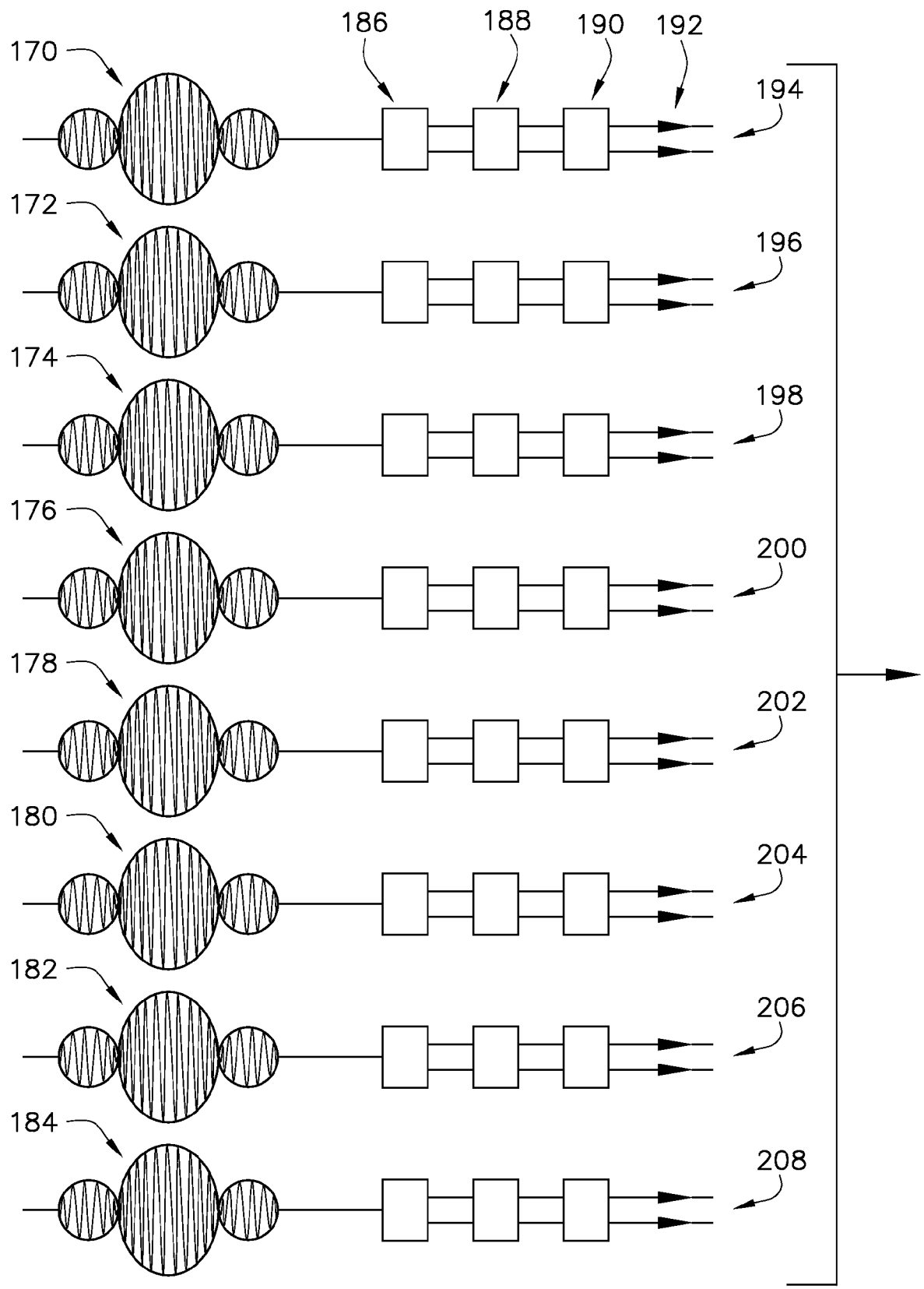
FIG. 6 is a block diagram of a number of signal splitters for a multi-channel RF transmission

FIG. 6 shows another implementation of signal splitting for an RF coil assembly having sixteen coil elements. Eight independent transmit channels or RF waveforms 170-184 are used as inputs. In one embodiment, the eight RF waveforms 170-184 in the aggregate comprise a multi-channel parallel transmission. For example, RF waveforms 170-184 may be designed according to a SENSE or GRAPPA parallel transmission technique. The waveforms may further be designed in addition, or as an alternative, to parallel transmission techniques, according to a dynamic RF shimming technique. Each RF waveform 170-184 is applied to a two-way power splitter 186, a pair of attenuators 188, a pair of phase shifters 190, and a pair of amplifiers 192 to produce a pair of driving input signals 194-208, respectively.

From the implementations shown in FIGS. 4-6, it will be appreciated that the features and advantages described herein may be extended to equivalently apply for an arbitrary number of RF waveform inputs which is less than or equal to the number of coil elements to be driven. Moreover, it is contemplated that the division of each independent RF transmit channel need not be equal. For example, in a four-channel transmission via an eight element coil assembly, one RF waveform could be divided into four driving inputs, another RF waveform could be divided into two driving inputs, and the remaining two RF waveforms could be applied to coil elements without splitting. In short, embodiments of the invention allow for M independent transmit channels to be applied to an N-element coil array, where M is less than or equal to N.

Figure 7:
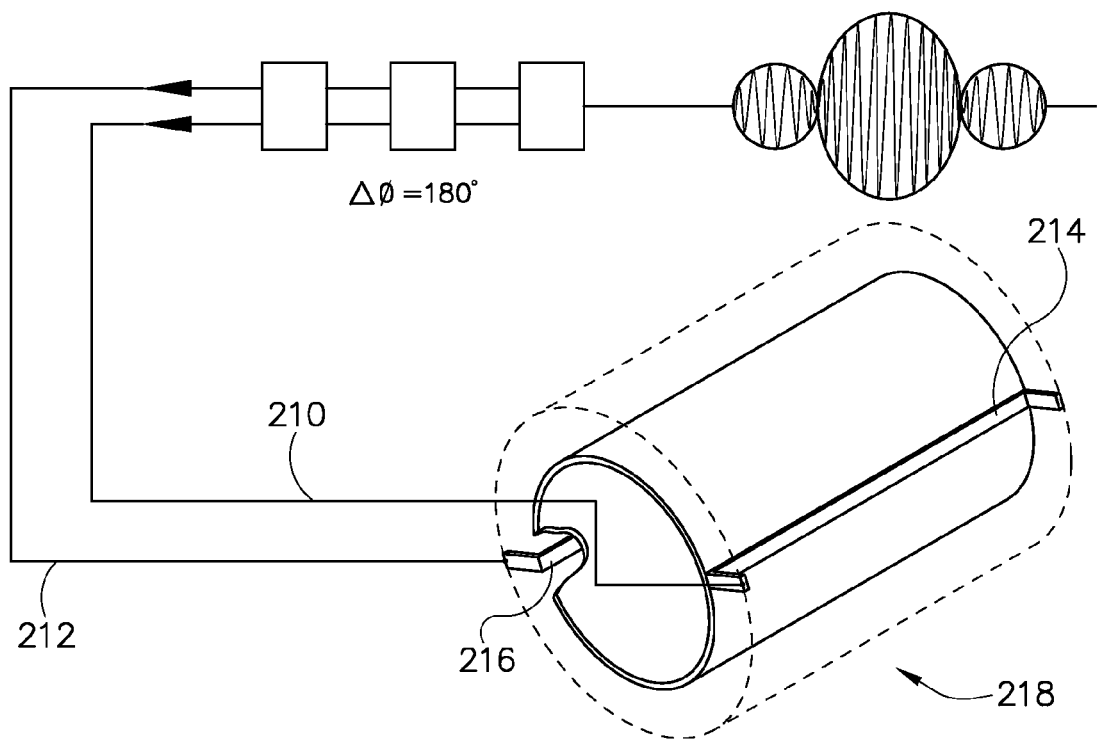
FIG. 7 is a diagram of one configuration for connecting a signal splitter to coil elements.

Referring now to FIG. 7, one pair of driving input signals 210, 212 from the signal splitting configuration of FIG. 6 is shown connected to two coil elements 214, 216 of an RF coil assembly 218. According to passive RF shimming techniques, for a homogenous $B_1$ field, driving input signals that are split from the same RF waveform or transmit channel are generally phase shifted according to the angular position at which they will be applied with respect to one another. In the embodiment shown, a first driving input 210 is applied at coil element 214. The second driving input is applied at a coil element 216 opposite the first coil element 214 about the circumference of coil assembly 218. Therefore, the second driving input is phase shifted by 180 degrees from the first driving input signal.

Figure 8:
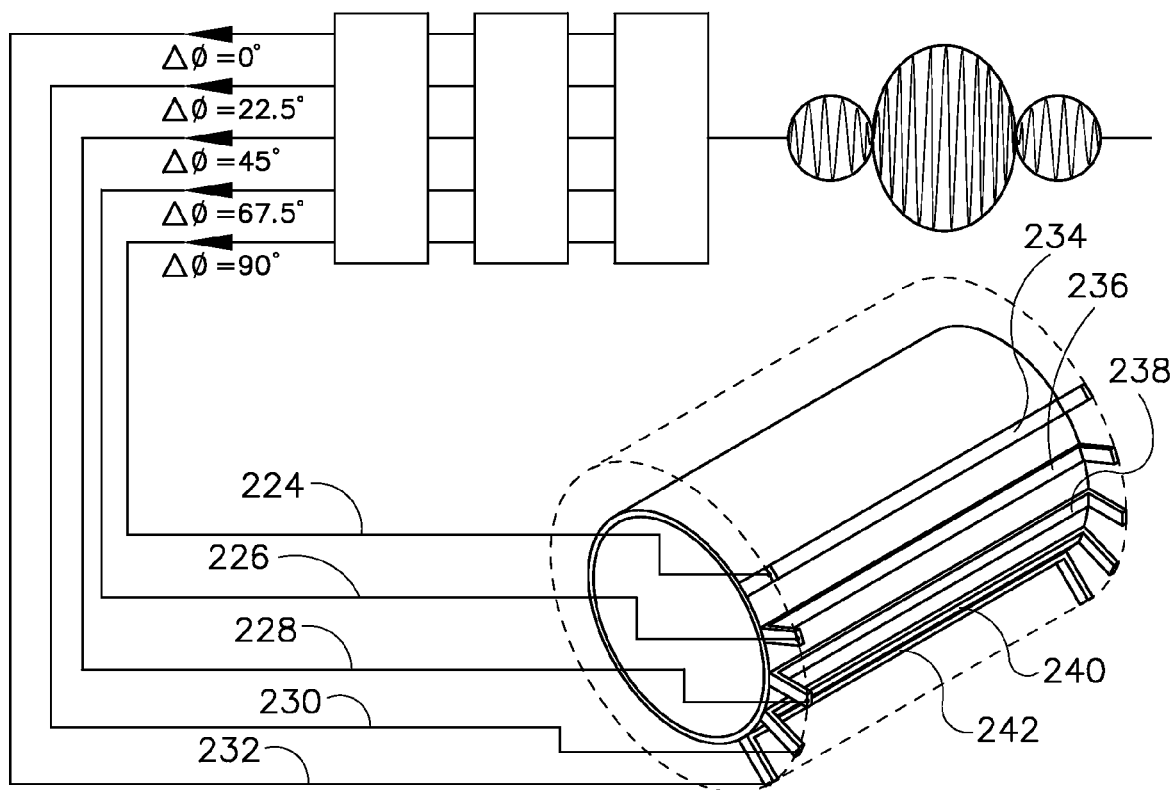
FIG. 8 is a diagram of another configuration for connecting a signal splitter to coil elements.

In contrast, FIG. 8 shows an alternative configuration in which driving input signals are connected more sequentially. As shown, one RF waveform 220 is divided by a signal splitting arrangement 222 into five driving input signals 224-232. The driving input signals 224-232 are connected to five neighboring coil elements 234-242 on a sixteen element RF coil assembly. Therefore, each driving input signal has a phase shift of 22.5 degrees from its neighbors. The first driving input signal 224 is not phase shifted and is applied at a first coil element 234. The second driving input signal 226 is phase shifted by 22.5 degrees from the first driving input signal 224 and is applied to a second coil element 236 next to the first coil element 234. The third driving input signal 228 is phase shifted by 22.5 degrees from the second driving input signal and 45 degrees from the first input signal. Third driving input signal 228 is connected to a third coil element 238 next to the second coil element 236. Similarly, fourth driving input signal 230 and fifth driving input signal 232 are phase shifted another 22.5 degrees each, and are applied at coil elements 240 and 242, respectively. Thus, it can be seen from the configurations shown in FIGS. 7 and 8 that RF waveforms may be divided and applied at any coil elements at any positions about an RF coil assembly.

Therefore, a number of embodiments of the present invention have been described. It has been demonstrated that an M-channel RF pulse sequence may be transmitted via an N-element RF coil assembly to achieve a variety of features and advantages.

In one embodiment of the present invention, an MR apparatus includes a main magnet, a plurality of gradient coils, an RF coil assembly, and a pulse module. The main magnet has a bore therethrough, about which the plurality of gradient coils are positioned. The RF coil assembly is disposed within the bore, and has a plurality of individual coil elements. The pulse module is adapted to output a plurality of RF transmit channels to the RF coil assembly for transmission during an imaging sequence. The number of individual coil elements of the RF coil assembly is greater than the number of RF transmit channels.

Another embodiment includes a method for configuring an MR transmit system. The method includes affixing a plurality of coil elements about a frame and connecting a first RF pulse input line to a first signal splitter. The outputs of the signal splitter are routed to drive less than all of the plurality of coil elements. The method further includes connecting at least one additional RF pulse input line to the remaining coil elements to drive the coil elements.

In a further embodiment of the invention, an RF coil assembly includes a volume coil structure, a driving input array, and at least one channel splitter. The volume coil array has an opening therethrough, a plurality of conductive segments positioned about its surface in a TEM arrangement, and an end ring. The driving input array receives a plurality of input signals representing a multi-channel transmission communicates the signals in order to drive the plurality of conductive segments. The at least one channel splitter is connected to receive a single channel of the multi-channel transmission and to provide at least two of the plurality of input signals.

Accordingly, the present invention has been described in terms of the preferred embodiment. It is recognized that equivalents, alternatives, and modifications, aside from those expressly stated, are possible and within the scope of the appending claims.

What is claimed is:

1. A magnetic resonance (MR) imaging apparatus comprising:
   a main magnet having a bore therethrough;
   a plurality of gradient coils positioned about the bore of the main magnet;
   an RF coil assembly disposed within the bore of the main magnet, the RF coil assembly having a plurality of individual coil elements;
   a pulse module adapted to output a plurality of RF transmit channels to the RF coil assembly for transmission during an imaging sequence; and
   wherein the plurality of individual coil elements of the RF coil assembly is greater in number than the plurality of RF transmit channels.

2. The MR imaging apparatus of claim 1 wherein the RF coil assembly is a transverse electro-magnetic (TEM) coil assembly.

3. The MR imaging apparatus of claim 1 wherein the RF coil assembly includes a plurality of de-coupling elements about an end ring thereof to decouple neighboring pairs of coil elements.

4. The MR imaging apparatus of claim 3 wherein the plurality of individual coil elements are spaced apart from one another by a distance such that a magnitude of mutual inductance experienced between non-neighboring coil elements is not appreciable with respect to magnitudes of the plurality of RF transmit channels.

5. The MR imaging apparatus of claim 1 wherein the plurality of RF transmit channels collectively define a parallel transmission sequence.

6. The MR imaging apparatus of claim 5 wherein the number of RF transmit channels is eight and the number of coil elements is sixteen.

7. The MR imaging apparatus of claim 1 further comprising:
   an RF transceiver;
   an RF switch connected between the RF transceiver and the RF coil assembly; and
   wherein the RF transceiver and the RF switch are controlled by the pulse module such that the RF coil assembly may be used for both transmit and receive operations.

8. The MR imaging apparatus of claim 1 further comprising an RF shield connected as a common return path for current applied in each coil element of the RF coil assembly.

9. The MR imaging apparatus of claim 1 further comprising at least one signal splitter connected to provide one independent RF transmit channel as a driving input to more than one coil element.

10. A method for configuring an MR transmit system comprising:
    affixing a plurality of coil elements about a frame;
    connecting a first RF pulse input line to a first signal splitter;
    routing outputs of the first signal splitter to drive less than all of the plurality of coil elements; and connecting at least one additional RF pulse input line to a remainder of the plurality of coil elements to drive the remainder of the plurality of coil elements.

11. The method of claim 10 further comprising substantially isolating neighboring pairs of coil elements from mutual inductance therebetween.

12. The method of claim 11 wherein affixing a plurality of coil elements about the frame includes selecting a width and an arrangement of the coil elements in order to reduce mutual inductance between non-neighboring pairs of coil elements.

13. The method of claim 12 wherein affixing the plurality of coil elements about the frame further includes affixing sixteen coil elements about the frame, each coil element being a strip-type element and having a width of approximately one-half inch.

14. The method of claim 10 further comprising connecting the first RF input line to a pulse module to conduct a first independent waveform and connecting the at least one additional RF pulse input line to a pulse module to conduct at least one additional independent waveform.

15. The method of claim 14 wherein connecting the at least one additional RF pulse input line to the remainder of the plurality of coil elements includes connecting a number of additional RF pulse input lines to the remainder of the plurality of coil elements, wherein the number of additional RF pulse input lines is fewer than the remainder of the plurality of coil elements.

16. The method of claim 15 further comprising:
connecting the number of additional RF pulse input lines to a number of additional signal splitters;
routing outputs of the first signal splitter and the number of additional signal splitters to phase shifters to generate phase shifted outputs; and
connecting a phase shifted output to each of the plurality of coil elements to drive the plurality of coil elements.

17. The method of claim 15 wherein the first RF pulse input line and the number of additional RF pulse input lines conduct eight independent parallel transmit channels to sixteen coil elements.

18. An RF coil assembly comprising:
a volume coil structure having an opening therethrough and an end ring;
a plurality of conductive segments positioned about a surface of the volume coil structure in a transverse electromagnetic (TEM) arrangement;
a driving input array configured to receive a plurality of input signals representing a multi-channel transmission and to communicate the plurality of input signals to drive the plurality of conductive segments; and
at least one channel splitter connected to receive a single channel of the multi-channel transmission and to provide at least two of the plurality of input signals.

19. The RF coil assembly of claim 18 further comprising:
a plurality of decoupling elements arranged at an end ring of the volume coil structure to decouple neighboring pairs of the plurality of conductive segments; and
an RF shield surrounding the volume coil structure to serve as a common current return path for the plurality of coil elements.

20. The RF coil assembly of claim 18 wherein the plurality of conductive segments comprise conductive strips lying along an axial dimension of the volume coil structure.

21. The RF coil assembly of claim 20 wherein the conductive strips have a width of approximately one-half inch and are uniformly spaced about a circumference of the volume coil structure.

22. The RF coil assembly of claim 18 wherein the multi-channel transmission is composed of M independent transmit channels and the plurality of conductive segments is composed of N conductive segments, wherein M is less than N.

23. The RF coil assembly of claim 18 further comprising one signal splitter for each of eight independent transmit channels of the multi-channel transmission to provide input signals for sixteen conductive segments.

* * * * *